(12) United States Patent
Ivanov

(10) Patent No.: US 10,956,687 B1
(45) Date of Patent: Mar. 23, 2021

(54) LOGARITHMIC AMPLIFIER

(71) Applicant: TEXAS INSTRUMENTS INCORPORATED, Dallas, TX (US)

(72) Inventor: Vadim Valerievich Ivanov, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/711,694

(22) Filed: Dec. 12, 2019

(51) Int. Cl.
*G06G 7/24* (2006.01)
*H03G 7/06* (2006.01)
*H03G 7/00* (2006.01)

(52) U.S. Cl.
CPC .............. *G06G 7/24* (2013.01); *H03G 7/06* (2013.01); *H03G 7/001* (2013.01)

(58) Field of Classification Search
CPC ............ G06G 7/24; H03G 7/001; H03G 7/06; H03G 11/002; H03F 1/34
See application file for complete search history.

(56) References Cited

U.S. PATENT DOCUMENTS

| 4,891,603 A * | 1/1990 | Oda ......................... G06G 7/24 327/350 |
| 2019/0116078 A1* | 4/2019 | Gollakota ............ H04B 7/0413 |

OTHER PUBLICATIONS

Texas Instruments. "Single-Supply, High Speed, Precision Logarithmic Amplifier." Burr-Brown Products from Texas Instruments. SBOS301A—May 2004—Revised Mar. 2007, pp. 1-30.

* cited by examiner

*Primary Examiner* — Long Nguyen
(74) *Attorney, Agent, or Firm* — John R. Pessetto; Charles A. Brill; Frank D. Cimino

(57) ABSTRACT

A logarithmic amplifier includes a logarithmic current preamplifier circuit and logarithmic amplifier circuit. The logarithmic current preamplifier circuit includes an inverting input terminal, an output terminal, and a first diode. The first diode is coupled between the inverting input terminal of the logarithmic current preamplifier circuit and the output terminal of the logarithmic current preamplifier circuit. The logarithmic amplifier circuit includes an inverting input terminal, an output terminal, and a second diode. The inverting input terminal of the logarithmic amplifier circuit is coupled to the output terminal of the logarithmic current preamplifier circuit. The second diode is coupled between the inverting input terminal of the logarithmic amplifier circuit and the output terminal of the logarithmic amplifier circuit.

11 Claims, 4 Drawing Sheets

LOGARITHMIC AMPLIFIER

BACKGROUND

A logarithmic amplifier is an electronic circuit that generates an output signal having a magnitude that is proportional to a logarithm of the input signal magnitude. Logarithmic amplifiers are used in many applications where signals of large dynamic range may be encountered to compress wide dynamic range input sianals. Outputs of photodiodes, ultrasonic receivers, and radar receivers are example of signals that are sometimes compressed using a logarithmic amplifier.

SUMMARY

A logarithmic amplifier with high bandwidth and low settling time is disclosed herein. In one example, a logarithmic amplifier includes a logarithmic current preamplifier circuit and logarithmic amplifier circuit. The logarithmic current preamplifier circuit includes an inverting input terminal, an output terminal, and a first diode. The first diode is coupled between the inverting input terminal of the logarithmic current preamplifier circuit and the output terminal of the logarithmic current preamplifier circuit. The logarithmic amplifier circuit includes an inverting input terminal, an output terminal, and a second diode. The inverting input terminal of the logarithmic amplifier circuit is coupled to the output terminal of the logarithmic current preamplifier circuit. The second diode is coupled between the inverting input terminal of the logarithmic amplifier circuit and the output terminal of the logarithmic amplifier circuit.

In another example, a logarithmic amplifier includes a logarithmic current preamplifier circuit, a logarithmic amplifier circuit, a resistor, and a diode. The logarithmic current preamplifier circuit includes an output terminal. The logarithmic amplifier circuit includes an inverting input terminal. The resistor includes a first terminal coupled to the output terminal, and a second terminal coupled to the inverting input terminal. The diode includes an anode terminal coupled to the output terminal, and a cathode terminal coupled to the inverting input terminal.

In a further example, a circuit includes a first logarithmic current preamplifier circuit, a second logarithmic current preamplifier circuit, and a differential amplifier circuit. The differential amplifier circuit includes a non-inverting input terminal and an inverting input terminal. The non-inverting input terminal is coupled to an output terminal of the first logarithmic current preamplifier circuit. The inverting input terminal is coupled to an output terminal of the second logarithmic current preamplifier circuit.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Figure 1:
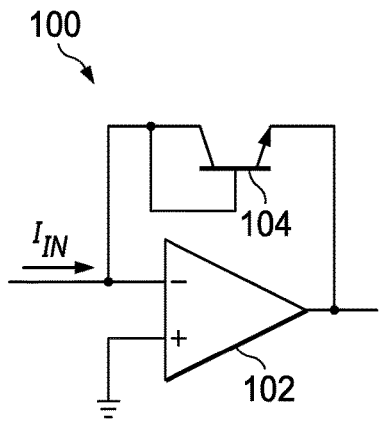
FIG. 1 shows a schematic diagram for an example logarithmic amplifier.

FIG. 1 shows a schematic diagram for an example logarithmic amplifier 100. The logarithmic amplifier 100 includes an amplifier 102 and diode-connected transistor 104 in the feedback path of the amplifier 102. The base-emitter voltage ($V_{BE}$) of the diode-connected transistor 104 is expressed as:

$$V_{BE} = \frac{kT}{q}\ln\left(\frac{I_{IN}}{I_S}\right)$$

where:
$I_{IN}$ is input current;
$I_S$ reverse current of the P-N junction of the diode-connected transistor 104;
T is absolute temperature;
K is Boltzmann's constant; and
q is the charge of an electron.

Logarithmic dependence of $V_{BE}$ on $I_{IN}$ spans 5-6 orders of magnitude, from pico-amperes to milli-amperes.

Speed is one important parameter of the logarithmic amplifier 100. At small input currents, speed is limited by the time constant formed by base-emitter capacitance ($C_D$) of the diode-connected transistor 104 and its equivalent resistance. The capacitance is defined by emitter size.

The equivalent resistance of the diode-connected transistor 104 is:

$$R_E = \frac{1}{g_m} = n\frac{kT/q}{I_{IN}} \qquad (2)$$

where n is a process-dependent parameter.

With an input current ($I_{IN}$) of 100 nano-amperes (nA), $R_E$ is about 260 kilo-ohms at 27° Celsius. With a practical value of $C_D$, on most any existing IC processes, of 0.5 to 1 picofarad, this $R_E C_D$ pole limits amplifier bandwidth to a range of 1-2 megahertz (MHz). This limitation is applicable to any semiconductor process and is practically independent of the transistor $f_t$(unity gain frequency of the transistor's short circuit current gain).

Figure 2:
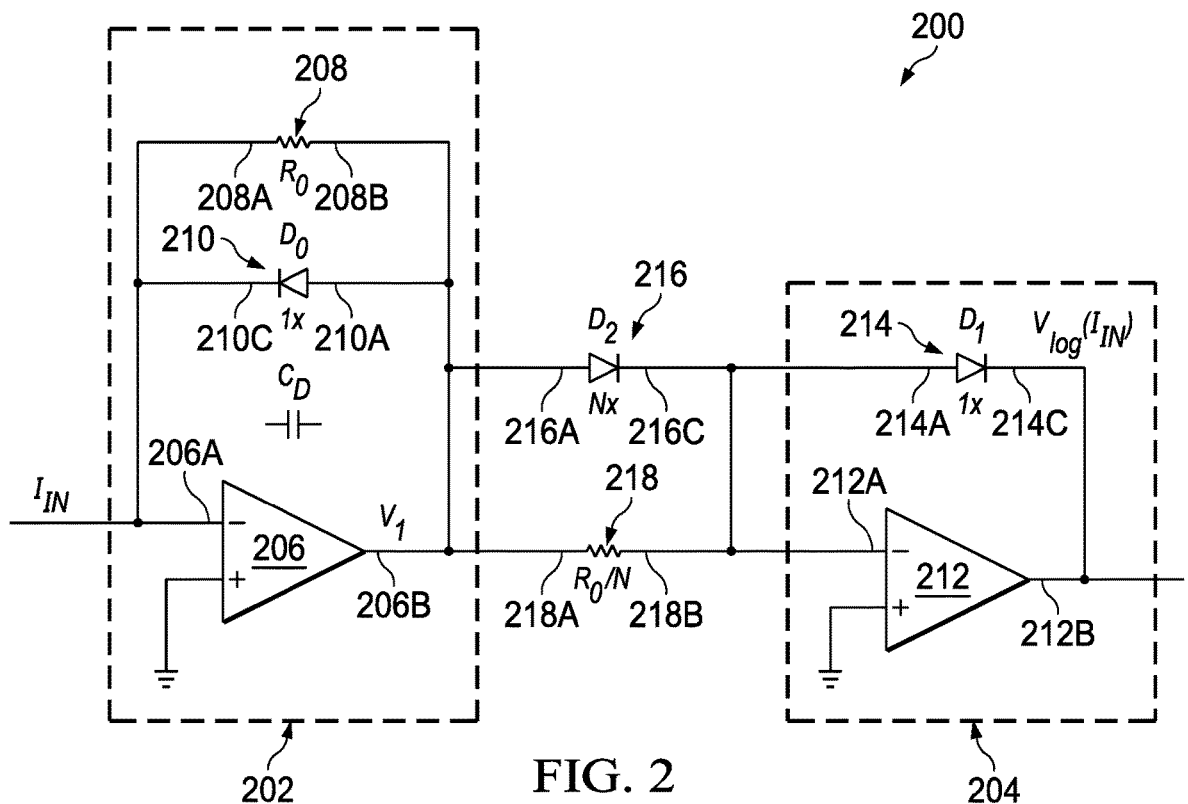
FIG. 2 shows a schematic diagram for an example logarithmic amplifier that includes a logarithmic current preamplifier circuit in accordance with this disclosure.

The logarithmic amplifiers of the present disclosure increase operational speed and bandwidth by using a logarithmic current preamplifier to drive a logarithmic amplifier circuit. FIG. 2 shows a schematic diagram for an example logarithmic amplifier 200 that includes a logarithmic current preamplifier circuit in accordance with this disclosure. The logarithmic amplifier 200 includes a logarithmic current preamplifier circuit 202, a logarithmic amplifier circuit 204, a diode 216, and a resistor 218. The logarithmic current preamplifier circuit 202 includes an amplifier 206, a resistor 208, and a diode 210. The amplifier 206 includes an inverting input terminal 206A that is coupled to a current source for reception of an input current to be converted to an output voltage that is logarithmically proportional to the input current.

The inverting input terminal 206A of the amplifier 206 is coupled to an output terminal 206B of the amplifier 206 via the resistor 208 and the diode 210. A terminal 208A of the resistor 208 is coupled to the inverting input terminal 206A of the amplifier 206, and a terminal 208B of the resistor 208 is coupled to the output terminal 206B of the amplifier 206. A cathode terminal 210C of the diode 210 is coupled to the inverting input terminal 206A of the amplifier 206, and an anode terminal 210A of the diode 210 is coupled to the output terminal 206B of the amplifier 206. The diode 210 is implemented as a diode-connected transistor in some examples of the logarithmic current preamplifier circuit 202.

The logarithmic amplifier circuit 204 includes an amplifier 212 and a diode 214. The amplifier 212 includes an inverting input terminal 212A that is coupled to the output terminal 206B of the amplifier 206. The inverting input terminal 206A is also coupled to an output terminal 212B of the amplifier 212 via the diode 214. A cathode terminal 214C of the diode 214 is coupled to the output terminal 212B of the amplifier 212, and an anode terminal 214A of the diode 214 is coupled to the inverting input terminal 212A of the amplifier 212. The diode 214 is implemented as a diode-connected transistor in some examples of the logarithmic amplifier circuit 204.

The output terminal 206B is coupled to the inverting input terminal 212A via the diode 216 and the resistor 218. An anode terminal 216A of the diode 216 is coupled to the output terminal 206B, and a cathode terminal 216C of the diode 216 is coupled to the inverting input terminal 212A. A terminal 218A of the resistor 218 is coupled the output terminal 206B of the amplifier 206, and a terminal 218B of the resistor 218 is coupled to the inverting input terminal 212A of the amplifier 212.

When $I_{IN}$ is small and the voltage across the resistor 208 is less than the voltage drop of the diode 210 ($I_{IN}R_0 < V_{BE}$), $I_{IN}$ flows through the resistor 208 and the voltage at the output terminal 206B of the amplifier 206 is $V_1 = I_{IN}R_0$. Thus, when $I_{IN}$ is less than a threshold current needed to produce voltage across the resistor 208 that exceeds the voltage drop of the diode 210, $I_{IN}$ flows through the resistor 208. The bandwidth of the logarithmic current preamplifier circuit 202 is defined by the pole formed by the resistance of the diode 210 and the capacitance of the diode 210 ($R_0 C_D$). The bandwidth of the logarithmic current preamplifier circuit 202 is large and does not depend on $I_{IN}$.

Figure 4:
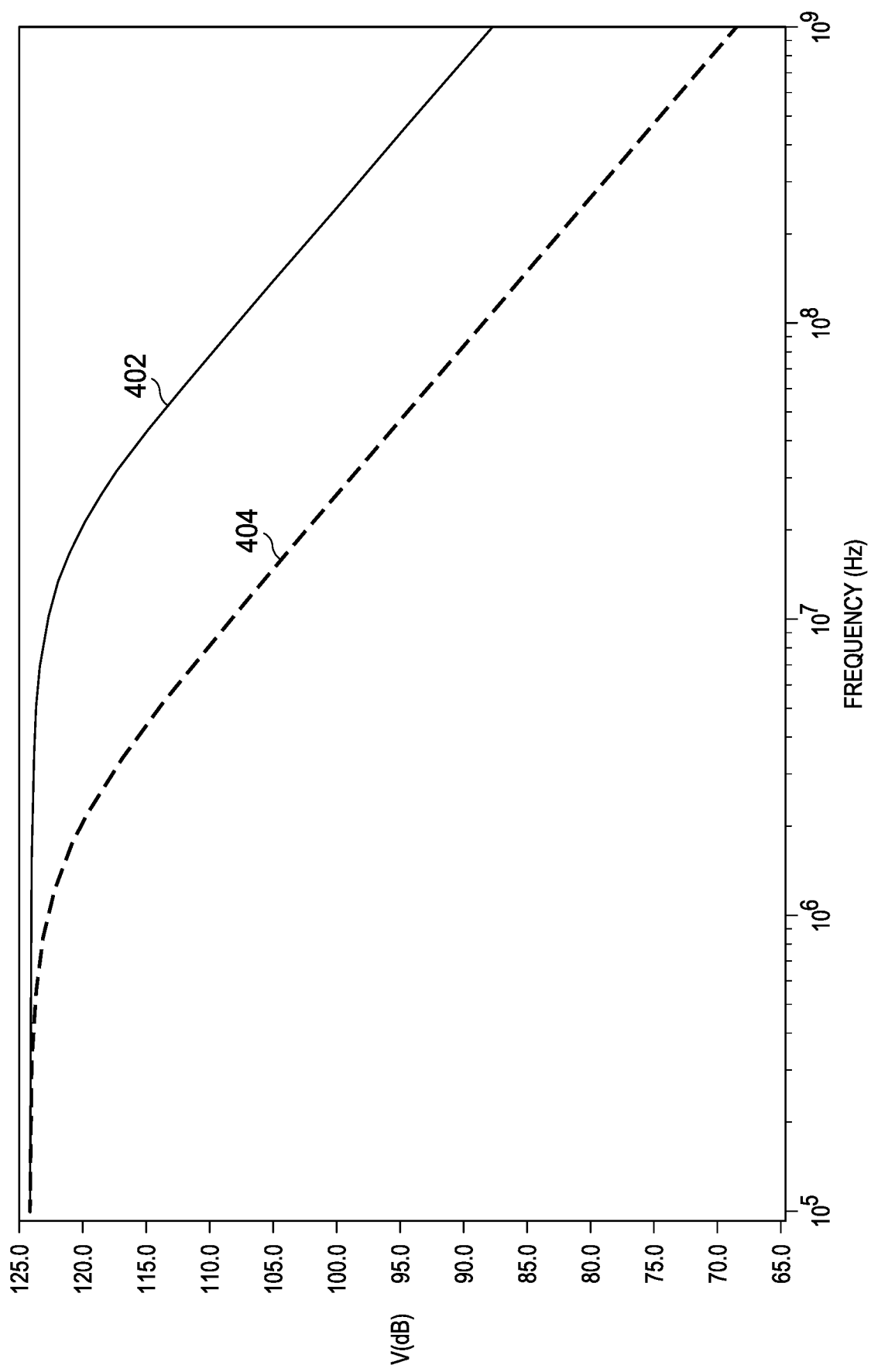
FIG. 4 shows a graph illustrating bandwidth of two logarithmic amplifiers.

Current through the resistor 218 (resistance $R_0/N$) is N times larger than $I_{IN}$. The diode 214 provides a logarithmic function of current ($N*I_{IN}$) passing through the resistor 218. The equivalent resistance of the diode 214 is reduced by a factor of N (due to the amplified current) and the bandwidth of the logarithmic amplifier circuit 204 is increased by N. Thus, with a small input current, bandwidth of the logarithmic amplifier 200 is established by, and current flow is through, the resistor 208, the resistor 218, and the diode 214. Gain by N adds some DC shift at the output of the logarithmic amplifier 200, which can be compensated by an opposite channel in a circuit as shown in FIG. 4.

$$(\log(AB)=\log(A)+\log(B)).$$

When $I_{IN}$ is large and the voltage across the resistor 208 is greater than the voltage drop of the diode 210 ($I_{IN}R_0 > V_{BE}$), $I_{IN}$ flows through the diode 210, and the voltage at the output terminal 206B of the amplifier 206 is limited by logarithmic function ($V_1 \sim \log(I_{IN})$). Thus, when $I_{IN}$ is greater than a threshold current needed to produce voltage across the resistor 208 that exceeds the voltage drop of the diode 210, $I_{IN}$ flows through the diode 210. Bandwidth of the logarithmic current preamplifier circuit 202 is large as the equivalent resistance of the diode 210 is small (due to the large $I_{IN}$ and transconductance). The voltage at the output terminal 206B of the amplifier 206 ($V_1$) is converted to current by the diode 216 with a gain set by a ratio of the resistance of the diode 210 to the resistance of the diode 216. Under these conditions, current flows in a path through the diode 210 and the diode 216. With Nx=N, a smooth transition is provided from gain by resistor ratio to gain by diode area ratio. The diode 214 provides the logarithmic function.

Figure 3A:
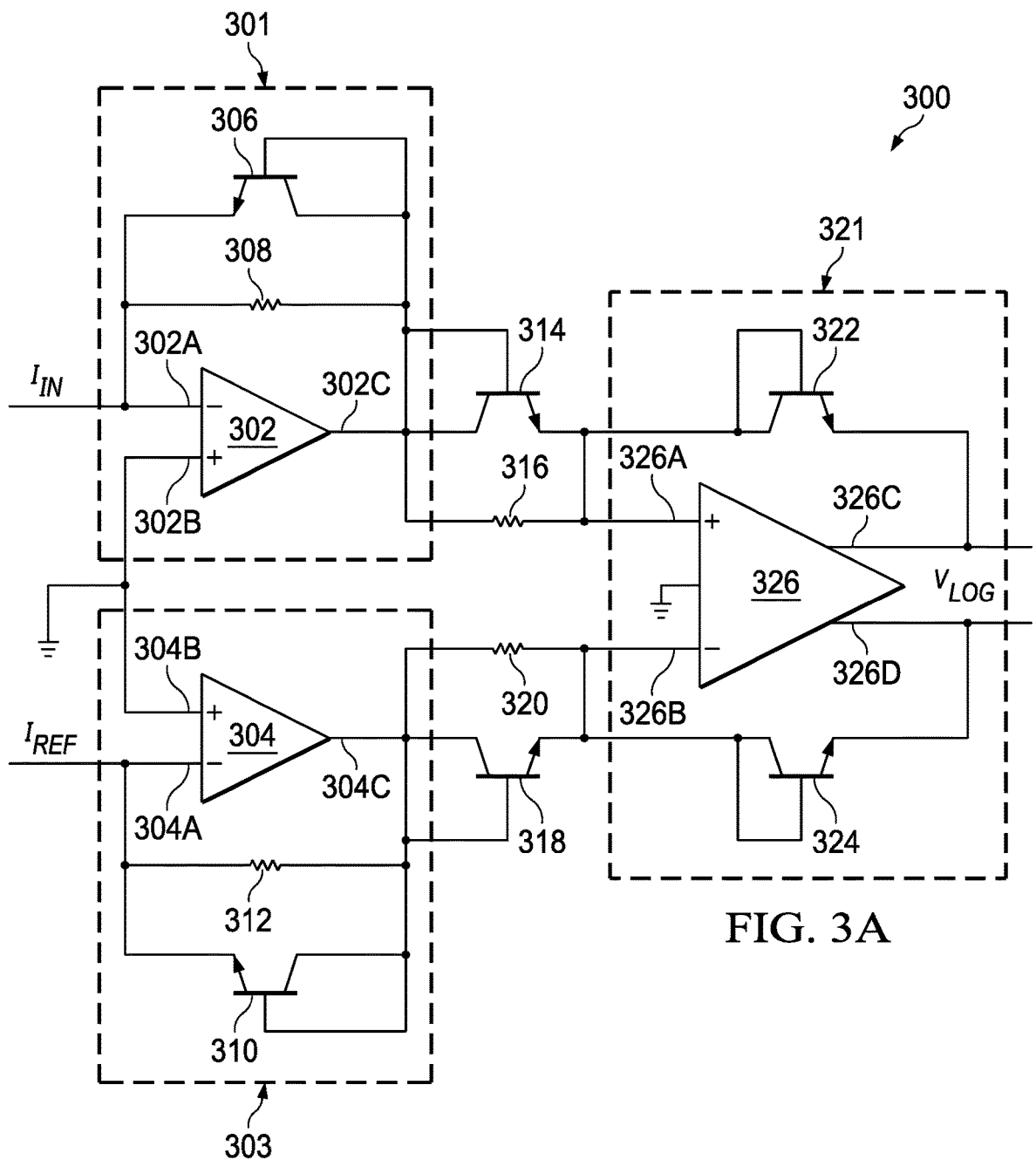
FIGS. 3A and 3B show circuits that includes a logarithmic amplifier in accordance with this disclosure.

FIG. 3A shows a circuit 300 that includes a logarithmic amplifier in accordance with this disclosure. The circuit 300 includes a logarithmic current preamplifier circuit 301, a logarithmic current preamplifier circuit 303, a diode-connected transistor 314, a resistor 316, a diode-connected transistor 318, a resistor 320, and a differential amplifier circuit 321. The logarithmic current preamplifier circuit 301 and the differential amplifier circuit 321 form an implementation of the 200. Similarly, the logarithmic current preamplifier circuit 303 and the differential amplifier circuit 321 form an implementation of the 200. The circuit 300 generates a logarithmic output voltage as a difference of a first logarithmic signal generated by the logarithmic current preamplifier circuit 301 and the differential amplifier circuit 321, and a second logarithmic signal generated by the logarithmic current preamplifier circuit 303 and the differential amplifier circuit 321. An inverting input terminal 302A of the logarithmic current preamplifier circuit 301 is coupled to a current source, such as a photodiode, in some applications. A non-inverting input terminal 302B of the logarithmic current preamplifier circuit 301 is coupled to a non-inverting input terminal 304B of the logarithmic current preamplifier circuit 303 in some implementations of the circuit 300. An inverting input terminal 304A of the logarithmic current preamplifier circuit 303 is coupled to a current source, such as a photodiode or a reference current source, in some applications.

The logarithmic current preamplifier circuit 301 includes an amplifier 302, a resistor 308 and a diode-connected transistor 306 coupled between the inverting input terminal 302A of the logarithmic current preamplifier circuit 301 and an output terminal 302C of the logarithmic current preamplifier circuit 301. The resistor 308 and a diode-connected transistor 306 respectively correspond to the amplifier 206, the resistor 208, and diode 210 of the logarithmic current preamplifier circuit 202. An output terminal 302C of the logarithmic current preamplifier circuit 301 is coupled to a non-inverting input terminal 326A of the differential amplifier circuit 321 via the diode-connected transistor 314 and the resistor 316, which respectively correspond to the diode 216 and the resistor 218 of the logarithmic amplifier 200.

The logarithmic current preamplifier circuit 303 includes an amplifier 304, a resistor 312 and a diode-connected transistor 310 coupled between the inverting input terminal 304A of the logarithmic current preamplifier circuit 303 and an output terminal 304C of the logarithmic current preamplifier circuit 303. The resistor 312 and the diode-connected transistor 310 respectively correspond to the amplifier 206, the resistor 208, and diode 210 of the logarithmic current preamplifier circuit 202. An output terminal 304C of the logarithmic current preamplifier circuit 303 is coupled to an inverting input terminal 326B of the differential amplifier circuit 321 via the diode-connected transistor 318 and the resistor 320, which respectively correspond to the diode 216 and the resistor 218 of the logarithmic amplifier 200.

The differential amplifier circuit 321 includes a differential amplifier 326, a diode-connected transistor 322, and a diode-connected transistor 324. The differential amplifier 326 corresponds to the amplifier 212 of the logarithmic amplifier circuit 204, and the diode-connected transistors 322 and 324 correspond to the diode 214 of the logarithmic amplifier circuit 204. An output terminal 326C of the logarithmic current preamplifier circuit 301 is coupled to the non-inverting input terminal 326A via the diode-connected transistor 322, and an output terminal 326D of the differential amplifier circuit 321 is coupled to the inverting input terminal 326B via the diode-connected transistor 324.

Thus, as illustrated in the circuit 300, the diode 210, the diode 214, and the diode 216 of the logarithmic amplifier 200 are implemented as diode-connected transistors in some circuits.

Figure 3B:
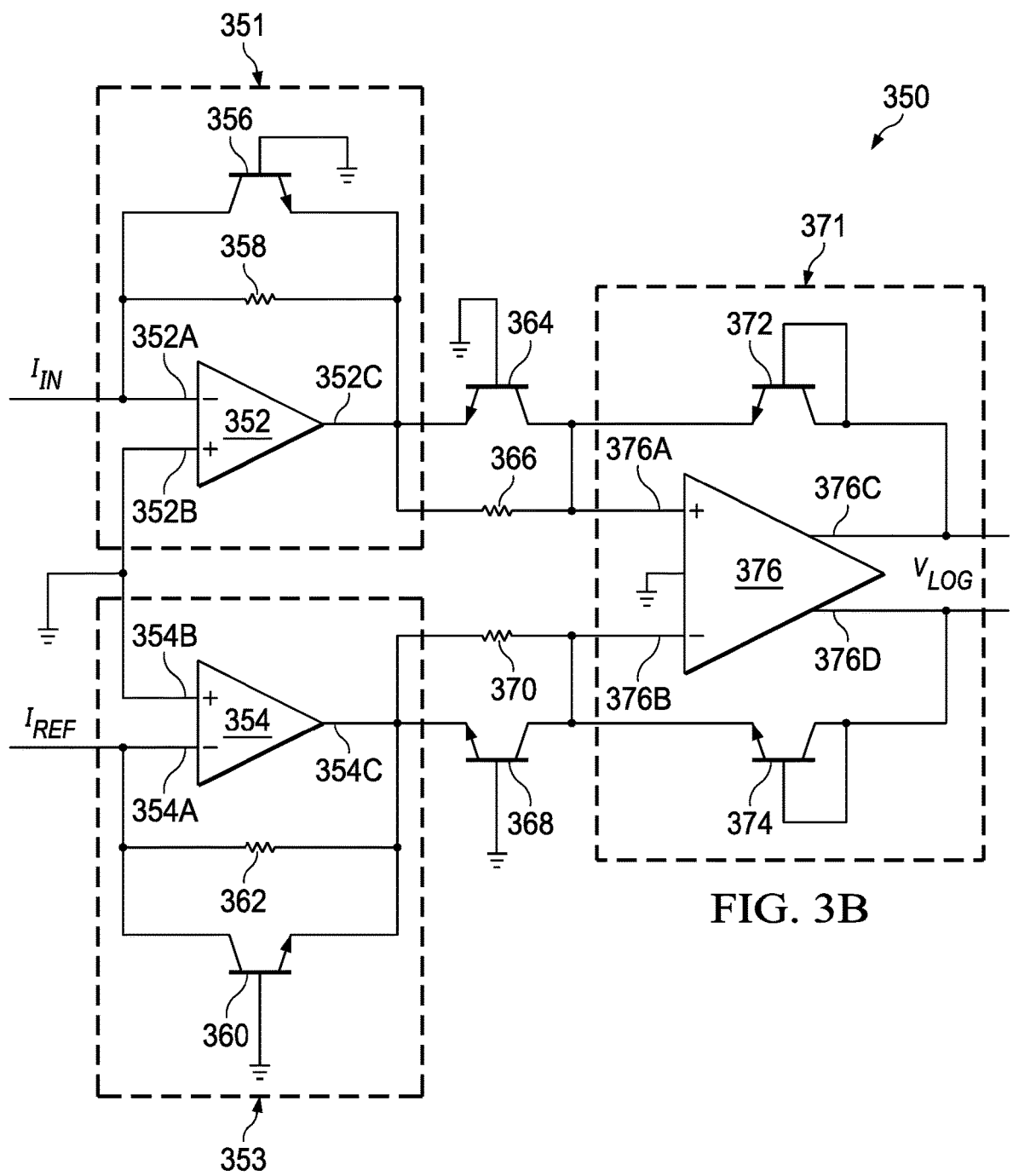

FIG. 3B shows a circuit 350 that includes a logarithmic amplifier in accordance with this disclosure. The circuit 350 includes a logarithmic current preamplifier circuit 351, a logarithmic current preamplifier circuit 353, a base-grounded transistor 364, a resistor 366, a base-grounded transistor 368, a resistor 370, and a differential amplifier circuit 371. The logarithmic current preamplifier circuit 351 and the differential amplifier circuit 371 form an implementation of the logarithmic amplifier 200. Similarly, the logarithmic current preamplifier circuit 353 and the differential amplifier circuit 371 form an implementation of the logarithmic amplifier 200. The circuit 350 generates a logarithmic output voltage as a difference of a first logarithmic signal generated by the logarithmic current preamplifier circuit 351 and the differential amplifier circuit 371, and a second logarithmic signal generated by the logarithmic current preamplifier circuit 353 and the differential amplifier circuit 371. The circuit 350 is similar to the circuit 300, but uses base-grounded transistors in place of the diode-connected transistors 306, 310, 314, and 318 of the circuit 300.

An inverting input terminal 352A of the logarithmic current preamplifier circuit 351 is coupled to a current source, such as a photodiode, in some applications. A non-inverting input terminal 352B of the logarithmic current preamplifier circuit 351 is coupled to a non-inverting input terminal 354B of the logarithmic current preamplifier circuit 353 in some implementations of the circuit 350. An inverting input terminal 354A of the logarithmic current preamplifier circuit 353 is coupled to a current source, such as a photodiode or a reference current source, in some applications.

The logarithmic current preamplifier circuit 351 includes an amplifier 352, a resistor 358, and a base-grounded transistor 306, which respectively correspond to the amplifier 206, the resistor 208, and diode 210 of the logarithmic current preamplifier circuit 202. An output terminal 352C of the logarithmic current preamplifier circuit 351 is coupled to a non-inverting input terminal 376A of the differential amplifier circuit 371 via the base-grounded transistor 364 and the resistor 366, which respectively correspond to the diode 216 and the resistor 218 of the logarithmic amplifier 200.

The logarithmic current preamplifier circuit 353 includes an amplifier 354, a resistor 362, and a base-grounded transistor 360, which respectively correspond to the amplifier 206, the resistor 208, and diode 210 of the logarithmic current preamplifier circuit 202. An output terminal 354C of the logarithmic current preamplifier circuit 353 is coupled to an inverting input terminal 376B of the differential amplifier circuit 371 via the base-grounded transistor 368 and the resistor 370, which respectively correspond to the diode 216 and the resistor 218 of the logarithmic amplifier 200.

The differential amplifier circuit 371 includes a differential amplifier 376, a diode-connected transistor 372, and a diode-connected transistor 374. The differential amplifier 376 corresponds to the amplifier 212 of the logarithmic amplifier circuit 204, and the diode-connected transistors 372 and 374 correspond to the diode 214 of the logarithmic amplifier circuit 204. An output terminal 376C of the differential amplifier circuit 371 is coupled to the non-inverting input terminal 376A via the diode-connected transistor 372, and an output terminal 376D of the differential amplifier circuit 371 is coupled to the inverting input terminal 376B via the diode-connected transistor 374.

Thus, as illustrated in the circuit 350, the diode 210 and the diode 216 of the logarithmic amplifier 200 are implemented as base-grounded transistors in some circuits.

FIG. 4 shows a graph illustrating bandwidth of the logarithmic amplifier 200 in comparison to bandwidth of the logarithmic amplifier 100. The bandwidth of the logarithmic amplifier 200 is illustrated as curve 402, and the bandwidth of the logarithmic amplifier 100 is illustrated as curve 404. FIG. 4 shows that the bandwidth of the 200 is significantly higher (e.g., over 10 times higher) than the bandwidth of the logarithmic amplifier 100.

Modifications are possible in the described embodiments, and other embodiments are possible, within the scope of the claims.

What is claimed is:

1. A logarithmic amplifier, comprising:
   a logarithmic current preamplifier circuit comprising:
      an inverting input terminal;
      an output terminal; and
      a first diode coupled between the inverting input terminal and the output terminal; and
   a logarithmic amplifier circuit comprising:
      an inverting input terminal coupled to the output terminal of the logarithmic current preamplifier circuit;
      an output terminal; and
      a second diode coupled between the inverting input terminal of the logarithmic amplifier circuit and the output terminal of the logarithmic amplifier circuit.

2. The logarithmic amplifier of claim 1, wherein:
   a cathode terminal of the first diode is coupled to the inverting input terminal of the logarithmic current preamplifier circuit; and
   an anode terminal of the first diode is coupled to the output terminal of the logarithmic current preamplifier circuit.

3. The logarithmic amplifier of claim 1, wherein:
   an anode terminal of the second diode is coupled to the inverting input terminal of the logarithmic amplifier circuit; and
   a cathode terminal of the second diode is coupled to the output terminal of the logarithmic amplifier circuit.

4. The logarithmic amplifier of claim 1, further comprising:
   a third diode comprising:
      an anode terminal coupled to the output terminal of the logarithmic current preamplifier circuit; and
      a cathode terminal coupled to the inverting input terminal of the logarithmic amplifier circuit.

5. The logarithmic amplifier of claim 1, further comprising:
   a resistor comprising:
      a first terminal coupled to the output terminal of the logarithmic current preamplifier circuit; and
      a second terminal coupled to the inverting input terminal of the logarithmic amplifier circuit.

6. The logarithmic amplifier of claim 1, wherein the logarithmic current preamplifier circuit comprising:

a resistor comprising:
  a first terminal coupled to the output terminal of the logarithmic current preamplifier circuit; and
  a second terminal coupled to the inverting input terminal of the logarithmic current preamplifier circuit.

7. The logarithmic amplifier of claim 6, wherein:
a first current flows from the inverting input terminal of the logarithmic current preamplifier circuit through the resistor to the output terminal of the logarithmic current preamplifier circuit based on the first current being less than a threshold; and
a second current flows from the inverting input terminal of the logarithmic current preamplifier circuit through the first diode to the output terminal of the logarithmic current preamplifier circuit based on the second current being greater than the threshold.

8. A logarithmic amplifier, comprising:
a logarithmic current preamplifier circuit comprising:
  an output terminal;
a logarithmic amplifier circuit comprising:
  an inverting input terminal;
a resistor comprising:
  a first terminal coupled to the output terminal; and
  a second terminal coupled to the inverting input terminal; and
a diode comprising:
  an anode terminal coupled to the output terminal; and
  a cathode terminal coupled to the inverting input terminal;
wherein:
the diode is a first diode; and
the logarithmic amplifier circuit comprises:
  an output terminal; and
  a second diode comprising:
    a cathode terminal coupled to the output terminal of the logarithmic amplifier circuit; and
    an anode terminal coupled to the inverting input terminal of the logarithmic amplifier circuit.

9. A logarithmic amplifier, comprising:
a logarithmic current preamplifier circuit comprising:
  an output terminal;
a logarithmic amplifier circuit comprising:
  an inverting input terminal;
a resistor comprising:
  a first terminal coupled to the output terminal; and
  a second terminal coupled to the inverting input terminal; and
a diode comprising:
  an anode terminal coupled to the output terminal; and
  a cathode terminal coupled to the inverting input terminal;
wherein:
the diode is a first diode; and
the logarithmic current preamplifier circuit comprises:
  an inverting input terminal; and
  a second diode comprising:
    an anode terminal coupled to the output terminal; and
    a cathode terminal coupled to the inverting input terminal of the logarithmic current preamplifier circuit.

10. The logarithmic amplifier of claim 9, wherein the resistor is a first resistor; and
the logarithmic current preamplifier circuit comprises:
  an inverting input terminal; and
  a second resistor comprising:
    a first terminal coupled to the output terminal; and
    a second terminal coupled to the inverting input terminal of the logarithmic current preamplifier circuit.

11. The logarithmic amplifier of claim 10, wherein:
a first current flows from the inverting input terminal of the logarithmic current preamplifier circuit through the second diode to the output terminal based on a first voltage across the second resistor being greater than a voltage drop of the second diode; and
a second current flows from the inverting input terminal of the logarithmic current preamplifier circuit through the second resistor to the output terminal based on a second voltage across the second resistor being less than a voltage drop of the second diode.

* * * * *